(12) United States Patent
Takeda et al.

(10) Patent No.: US 8,623,510 B2
(45) Date of Patent: Jan. 7, 2014

(54) GRAPHITE MATERIAL AND METHOD FOR MANUFACTURING THE SAME

(75) Inventors: Akiyoshi Takeda, Kanonji (JP); Masayuki Ito, Kanonji (JP)

(73) Assignee: Toyo Tanso Co., Ltd., Osaka (JP)

( * ) Notice: Subject to any disclaimer, the term of this patent is extended or adjusted under 35 U.S.C. 154(b) by 1110 days.

(21) Appl. No.: 12/448,411

(22) PCT Filed: Dec. 21, 2007

(86) PCT No.: PCT/JP2007/074647
§ 371 (c)(1),
(2), (4) Date: Jun. 19, 2009

(87) PCT Pub. No.: WO2008/078679
PCT Pub. Date: Jul. 3, 2008

(65) Prior Publication Data
US 2010/0009193 A1 Jan. 14, 2010

(30) Foreign Application Priority Data
Dec. 22, 2006 (JP) .................................. 2006-345937

(51) Int. Cl.
*C01B 31/00* (2006.01)
*C01B 31/04* (2006.01)
*C01B 31/30* (2006.01)

(52) U.S. Cl.
USPC ........... 428/408; 423/414; 423/439; 423/440; 423/448

(58) Field of Classification Search
USPC .................. 428/408; 423/439, 440, 448, 345
See application file for complete search history.

(56) References Cited

U.S. PATENT DOCUMENTS

| | | | | |
|---|---|---|---|---|
| 2,992,901 A | * | 7/1961 | Fisher et al. | 423/448 |
| 3,563,705 A | * | 2/1971 | Grindstaff et al. | 423/266 |
| 3,969,131 A | * | 7/1976 | Fatzer et al. | 378/144 |
| 5,525,276 A | * | 6/1996 | Okuyama et al. | 264/29.3 |
| 6,503,626 B1 | * | 1/2003 | Norley et al. | 428/408 |
| 6,649,265 B1 | * | 11/2003 | Kawamura et al. | 428/408 |
| 2004/0126306 A1 | * | 7/2004 | Ochiai et al. | 423/448 |
| 2005/0158550 A1 | * | 7/2005 | Ohta et al. | 428/407 |

FOREIGN PATENT DOCUMENTS

| | | |
|---|---|---|
| JP | 60-246216 A | 12/1985 |
| JP | 2005-200239 A | 7/2005 |
| JP | 2006-298687 A | 11/2006 |

OTHER PUBLICATIONS

Zhang et al. "Effects of dopants on properties and microstructure of doped graphite." 2002. Elsevier. Journal of Nuclear Materials. vol. 301. pp. 187-192.*

(Continued)

*Primary Examiner* — Callie Shosho
*Assistant Examiner* — Nicholas W Jordan
(74) *Attorney, Agent, or Firm* — Kubovcik & Kubovcik

(57) ABSTRACT

Provided are a graphite material, which has excellent bonding characteristics to semiconductor and efficiently dissipates heat generated from the semiconductor, and a method for manufacturing such material. The graphite material is provided by adding at least two kinds of elements selected from among silicon, zirconium, calcium, titanium, chromium, manganese, iron, cobalt, nickel, calcium, yttrium, niobium, molybdenum, technetium, ruthenium and compounds containing such elements, and by performing heat treatment. The graphite material is characterized in having a thickness of the 112 face of the graphite crystal of 15 nm or more by X-ray diffraction, and an average heat conductivity of 250 W/(m·K) or more in the three directions of the X, Y and Z axes.

24 Claims, 2 Drawing Sheets

(56) References Cited

OTHER PUBLICATIONS

Iwashita et al. "Procedure for the measurements of lattice parameters and crystallite sizes of carbon materials by X-ray diffraction." 2004. Elsevier. Carbon. vol. 42. pp. 705-714.*

Garcia-Rosales et al. "Improvement of the thermo-mechanical properties of fine grain graphite by doping with different carbides." 2002. Elsevier. Journal of Nuclear Materials. vol. 307-311. pp. 1282-1288.*

Haipeng Qiu et al., "Properties and microstructure of graphitised ZrC/C or SiC/C composites", Carbon, Elsevier, Oxford, vol. 43, No. 5, pp. 1021-1025, Jan. 1, 2005.

Haipeng Qiu et al., "Thermal conductivity and microstructure of Ti-doped graphite", Carbon, Elsevier, Oxford, vol. 41, No. 5, pp. 973-978, Jan. 1, 2003.

European Search Report issued in European patent application No. 07859928.9-1354/212616 provided with EPO Communication dated Aug. 30, 2013.

* cited by examiner

GRAPHITE MATERIAL AND METHOD FOR MANUFACTURING THE SAME

This application is a 371 of international application PCT/JP2007/074647, filed Dec. 21, 2007, which claims priority based on Japanese patent application No. 2006-345937 filed Dec. 22, 2006, which is incorporated herein by reference.

TECHNICAL FIELD

The present invention relates to a graphite material having a high thermal conductivity which can be used as a heat-dissipating member for efficient dissipation or diffusion of heat generated from an electronic device or optical part such as of a semiconductor and also to a method for manufacturing thereof.

BACKGROUND ART

A recent electronic device such as of a semiconductor continues to increase its performance. On the other hand, heat generated therefrom is also increasing. Since an electronic device such as of a semiconductor has an application limit of temperature, the generated heat must be dissipated or diffused rapidly and efficiently. Accordingly, a material having a high thermal conductivity is joined to an electronic device such as of a semiconductor to stabilize its performance. This material is generally called heat-dissipating material.

The properties required for the heat-dissipating material include a high thermal conductivity and non-occurrence of crack and separation at a joint surface even if it is joined to an electronic device such as of a semiconductor.

Copper is known as a metal having a superior thermal conductivity. However, its thermal expansion coefficient is greater than $10\times10^{-6}$/K and 2-3 times greater than that of a semiconductor (silicon: $3.5\times10^{-6}$/K, gallium arsenide: $5.7\times10^{-6}$/K). If such copper is joined to a semiconductor and heat is applied to the resulting combination, a large thermal stress is produced at a joint surface due to a difference in thermal expansion coefficient between them to result in the occurrence of crack or separation, which has been a problem.

In the effort to adjust a thermal expansion coefficient, copper has been used in combination with molybdenum or tungsten, i.e., in the form of copper molybdenum or copper tungsten. Their thermal expansion coefficients are not greater than $6\times10^{-6}$/K and their thermal conductivities are 180-220 W(m·K).

However, a semiconductor will very likely continue to increase its performance. There accordingly is a need for a material which releases heat originating from a semiconductor more efficiently than before.

Since a graphite material is light-weight and low in thermal expansion coefficient due to its basic properties, it has an advantage in being hard to separate even if joined to a silicon semiconductor.

A graphite material consisting basically of graphite particles is reported to exhibit the highest thermal conductivity of 220 W(m·K).

If the thermal conductivity of a graphite material is to be increased, significant growth of its crystal must be accomplished. A method is known for achieving significant crystal growth by adding a catalyst metal to a graphite material and then subjecting the resultant to a heat treatment. However, the use of natural or artificial graphite as a raw aggregate material leads to the absence of a network which links graphite particles to each other. As a result, heat transfer of the obtained graphite product is rendered insufficient. Also, in the case where a binder is used, no shrinkage of the aggregate material occurs during the heat treatment. This increases the occurrence of pores to result in the difficulty to obtain a sufficient thermal conductivity (Patent Literature 1).

In a method wherein a metal is added to a graphite precursor, a heat treatment activates the added metal to promote growth of a graphite crystal so that crystallization of a graphite material is accelerated. Silicon carbide or the like is used for such a catalyst metal. However, the resulting thermal conductivity is still low in value, about 200 W(m·K).

Patent Literature 1: Japanese Patent Laid-Open No. Sho 60-246216

DISCLOSURE OF THE INVENTION

It is an object of the invention to provide a graphite material which has such a high thermal conductivity that enables efficient heat dissipation, as well as providing a method for manufacturing the graphite material.

The graphite material of the present invention is characterized as having a thickness of a graphite crystal in the 112 face of 15 nm or greater under X-ray diffraction and a mean thermal conductivity of 250 W (m·K) or greater over the three directions along X, Y and Z axes.

The graphite material of the present invention is a graphite material which has an advanced degree of graphitization as illustrated by the 112 face thickness of the graphite crystal of 15 nm or greater under X-ray diffraction. It accordingly exhibits a high thermal conductivity as illustrated by the mean thermal conductivity of 250 W(m·K) or greater over the three directions along the X, Y and Z axes.

The graphite material of the present invention can be obtained by adding to a raw material of the graphite material at least two types selected from silicon, zirconium, calcium, titanium, chromium, manganese, iron, cobalt, nickel, calcium, yttrium, niobium, molybdenum, technetium and ruthenium elements, and compounds containing those elements, and subjecting the resultant to a heat treatment, for example. The above-listed elements have been confirmed to remain in the graphite material finally obtained.

Hence, the graphite material of the preferred embodiment in accordance with the present invention is characterized as containing at least two types selected from silicon, zirconium, calcium, titanium, chromium, manganese, iron, cobalt, nickel, calcium, yttrium, niobium, molybdenum, technetium and ruthenium elements, and compounds containing those elements.

The compounds containing such elements may exist in the form of carbides in the graphite material, for example. For example, in the case where silicon carbide and zirconium oxide are added, they have been confirmed to exist in the form of silicon carbide and zirconium carbide in the final graphite material.

Also, in the case where silicon carbide and titanium oxide are added, they have been confirmed to exist in the form of silicon carbide and titanium carbide in the final graphite material.

The amount of the element or compound containing the element that remains in the graphite material is generally 0.01 mass % or greater. The element or compound containing the element can be measured by EPMA analysis. In the EPMA analysis, such residual amount is expressed by an elemental concentration (mass %), regardless of whether it is for the element or for the compound containing the element. The residual amount in the graphite material of the present invention, when measured by EPMA analysis, is 0.1 mass % or greater, for example. The residual amount of such element or compound containing the element is preferably small, preferably not greater than 5 mass %, more preferably not greater than 3 mass %, further preferably not greater than 2 mass %. The larger residual amount is mostly attributed to a lower temperature applied in the heat treatment. In this case, crystal growth has not progressed sufficiently. The specified range is preferably used as a measure of growth or as a measure of a heat treatment.

As described above, the graphite material of the present invention can be obtained by allowing a raw material of graphite to contain at least two types selected from silicon, zirconium, calcium, titanium, chromium, manganese, iron, cobalt, nickel, calcium, yttrium, niobium, molybdenum, technetium and ruthenium elements and compounds containing such elements, and subjecting the resultant to a heat treatment.

That is, the method of the present invention for manufacturing the graphite material is characterized as including the steps of allowing a milled powder obtained via mixing, kneading and milling of an aggregate material and a binder to contain at least two types selected from silicon, zirconium, calcium, titanium, chromium, manganese, iron, cobalt, nickel, calcium, yttrium, niobium, molybdenum, technetium and ruthenium elements and compounds containing such elements to prepare a molding powder; and subjecting the molding powder to molding and a heat treatment.

In accordance with the manufacturing method of the present invention, the above-described graphite material of the present invention can be manufactured. Accordingly, a graphite material can be manufactured which has such a high thermal conductivity that enables efficient dissipation of heat.

In the manufacturing method of the present invention, 100 parts by mass of coke (mean particle size of 50-100 μm) serving as an aggregate material and 10-70 parts by mass of a coal tar pitch as a binder may be mixed together and kneaded with heating to prepare a combined mass which is subsequently milled to provide a milled powder (mean particle size of 80-300 μm), for example. Meanwhile, a combination of silicon carbide and zirconium oxide (particle size range of 20-100 μm) or a combination of silicon carbide and titanium oxide (particle size range of 20-100 μm) is provided as the compound for addition to a raw material of graphite. This is mixed in the milled powder in the amount of 1-10 parts by mass, based on the mass of the milled powder.

The thus-obtained molding powder is molded into a shape such as by an impression, hydrostatic molding or extrusion process. The molded shape is subjected to a heat treatment at about 1,000° C. A molding pressure is 100-2,000 kgf/cm$^2$, for example. If it is less than 100 kgf/cm$^2$, the molded shape may be broken by subsequent handling. If it is greater than 2,000 kgf/cm$^2$, the milled powder itself may be broken to reduce its properties. Thereafter, the pitch is impregnated into pores produced during the heat treatment. A heat treatment is again carried out at about 1,000° C. and finally at 2,800-3,200° C. to obtain a graphite material.

As described above, the amount of the added element compound (a combination of silicon carbide and zirconium oxide or a combination of silicon carbide and titanium oxide) is preferably 1-10 parts by mass, based on 100 parts by mass of coke. If it is less than 1 part by mass, the action of prompting growth of a graphite crystal may not be obtained sufficiently. If it is greater than 10 parts by mass, a probability of occurrence of holes in the obtained graphite block may increase, which is undesirable.

The obtained graphite material has a higher thermal conductivity than graphite materials reported heretofore, copper molybdenum, copper tungsten and the like and its thermal expansion coefficient is not greater than 6×10$^6$/K. Accordingly, it has a superior joining property to a semiconductor and can dissipate heat from a semiconductor efficiently.

In the manufacture of conventional graphite materials, a heat treatment at a temperature of 2,500° C. or greater initiates growth of a graphite crystal and thereby allows a graphite material to exhibit properties such as a thermal conductivity peculiar to the graphite material and a low thermal expansion coefficient. Heating at a temperature of 2,500° C. or greater also evaporates impurities, either included in a raw material or mixed during a manufacturing process, to increase a purity of carbon atoms. The conventional method wherein a metal is added to a graphite precursor increases a purity of carbon atoms to the degree that the added element remains at the ppm level.

On the other hand, in the present invention, a compound is added which has such a high melting point that a compound of the added metal remains even if heated at a temperature of 2,800-3,000° C. In the present invention, at least two types of elements or compounds containing such elements are added. This establishes two or more stages of temperature ranges where a function to promote growth of a graphite crystal arises, with the least overlapping thereof, and successfully promotes growth of a graphite crystal over a wide temperature range of 1,000-3,000° C., for example.

In the present invention, the action of promoting growth of a graphite crystal is preferably continued over a range from about 1,000° C., which is a heat treatment temperature subsequent to the molding treatment, to a final heat treatment temperature of 2,800-3,200° C. For example, two or more elements which differ in melting point or decomposition temperature from each other or compounds containing such elements are each added by a small amount. Preferably, the above action by each additive occurs within a range of about 1,000-3,000° C. For example, two or more additives are selected such that the action by a first additive reaches a peak at 2,300° C. and the action by a second additive reaches a peak at 2,800° C.

In the present invention, three or more additives may be added. Preferable, the respective temperature ranges where those additives exhibit a catalytic effect are established with the least overlapping thereof.

Since silicon carbide decomposes at 1,410° C. and has a boiling point of 2,600° C., the greater part thereof decomposes and then evaporates in the temperature range of about 1,000-3,000° C. Since zirconium oxide has a melting point of 1,855° C. and a boiling point of 4,409° C., it exhibits the action of promoting growth of a graphite crystal in a temperature range higher than a temperature range where silicon carbide acts. In the case of titanium oxide, its melting point is 1,750° C. Accordingly, the titanium oxide also exhibits the action of prompting growth of a graphite crystal in a temperature range higher than the temperature range where silicon carbide acts.

In the present invention, two or more additives are used which differ from each other in melting point, decomposition temperature, boiling point or the like, as described above. Such use enables reduction in amount of metals added, compared to the conventional metal addition method, and thus prevents the occurrence of large holes in the graphite material finally obtained.

The first additive which exhibits the action of promoting growth of a graphite crystal at a relatively low temperature can be illustrated by the following. Those written in brackets indicate melting points.

First additive: silicon dioxide (1,500° C.), silicon (1,200° C.), manganese carbide (1,300° C.), manganese monoxide (1,700° C.), manganese (1,200° C.), iron(III) oxide (1,400° C.), iron (1,400° C.), cobalt (1,500° C.), nickel (1,400° C.)

The second additive which exhibits the action of promoting growth of a graphite crystal at a relatively high temperature can be illustrated by the following.

Second additive: silicon monoxide (1,700° C.), vanadium (1,800° C.), chromium monoxide (1,900° C.), chromium (1,900° C.), cobalt monoxide (1,800° C.), nickel oxide (1,900° C.), vanadium carbide (2,600° C.), calcium carbide (2,300° C.), calcium oxide (2,400° C.), niobium (2,400° C.), molybdenum (2,600° C.), technetium (2,100° C.), ruthenium (2,200° C.)

As listed above, silicon carbide is most preferred for the first additive while zirconium oxide and titanium oxide are most preferred for the second additive.

A mean particle diameter of the additive is preferably within the range of 10-100 μm. This is because the additive is rendered more dispersible if its mean particle diameter is comparable to or less than a mean particle size of coke serving as an aggregate material, 50-100 μm, or a mean particle size of the milled powder, 80-300 μm. If the mean particle diameter falls outside the above-specified range, it becomes difficult for the additive to be mixed with the milled powder uniformly, which is not desirable. The loading of the additive is preferably 1-10%, more preferably 5-10%, based on the mass of the milled powder of the combined mass containing the aggregate material and the binder. This causes effective occurrence of the action in the present invention, resulting in obtaining a high thermal conductivity.

In the present invention, a thickness of the graphite crystal in the 112 face can be determined by an evaluating method of a degree of graphitization according to the powder X-ray diffraction method as provided by the Gakushin method.

The graphite material of the present invention may be the one which has further experienced a high purification treatment. Illustrating the high purification treatment, high purification can be achieved, for example, by delivering a flow of a halogen gas such as chlorine, chlorine compound, fluorine or fluorine compound as a temperature reaches about 2,000° C. or greater in a graphitization process to thereby convert impurities in graphite to low-boiling halides (chlorides or fluorides) for evaporation. Such high purification treatment accomplishes efficient removal of a carbide, such as of boron or vanadium, that is hardly removable by a thermochemical method.

The graphite-metal composite material of the present invention is characterized in that it is obtained by impregnating a metal or an alloy in the graphite material of the present invention.

Impregnation of a metal or an alloy can be achieved by a conventionally-known method. For example, a metal or an alloy can be impregnated by allowing oxygen-free copper to melt in an inert atmosphere, dipping the graphite material of the present invention in the melt and applying a pressure, e.g., 1-10 MPa. Examples of metals and alloys for impregnation include copper, copper alloys, aluminum and aluminum alloys.

The metal-coated graphite material of the present invention is characterized in that it is obtained by coating a metal on a surface of the graphite material of the present invention or the graphite-metal composite material of the present invention.

Any conventionally-known method can be utilized to coat the metal. Examples of useful methods include plating, pressure bonding and coating. The type of the metal coated is not particularly specified. Examples include iron, iron alloys, copper, copper alloys, aluminum and aluminum alloys.

The heat dissipating member of the present invention is characterized as using the graphite material of the present invention, the graphite-metal composite material of the present invention or the metal-coated graphite material of the present invention.

The semiconductor electronic device of the present invention is characterized as using the above heat dissipating member.

EFFECT OF THE INVENTION

In accordance with the present invention, a graphite material can be provided which has a high thermal conductivity and can thus dissipate heat efficiently.

BEST MODE FOR CARRYING OUT THE INVENTION

Figure 1:
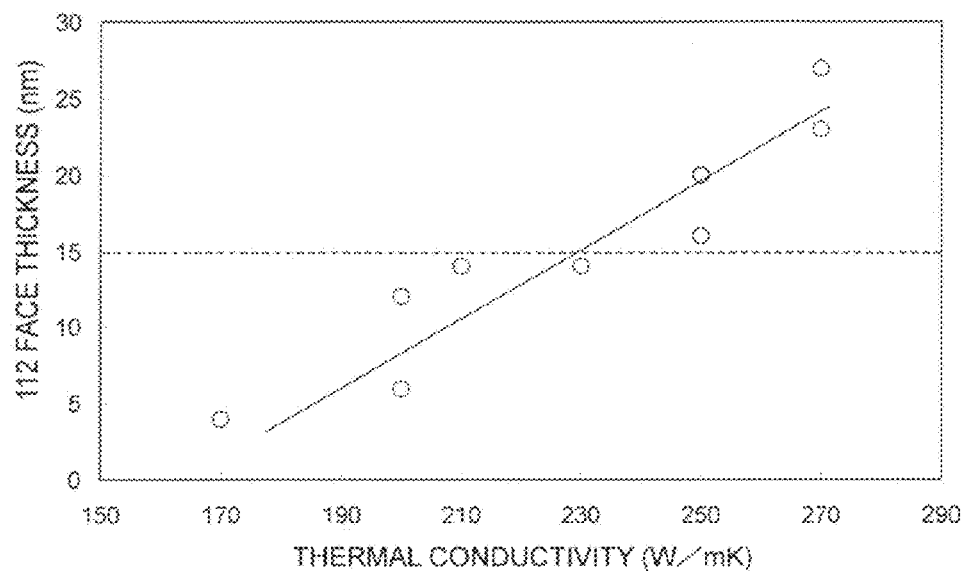
FIG. 1 a graph showing a relationship between the 112 face thickness of a graphite crystal and the thermal conductivity.

The following specific examples illustrate the present invention but are not intended to be limiting thereof.

Examples 1-4 and Comparative Examples 1-5

In the following examples and comparative examples, graphite materials were manufactured by a manufacturing method including the below-outlined first through third steps.

(Manufacturing Method of Graphite Material)

First step: 100 parts by mass of a needle coke powder (particle size range of about 100 μm) as an aggregate material and 10-70 parts by mass of a coal tar pitch (which is rendered into a liquid form when heated) are kneaded to prepare a combined mass which is subsequently milled to provide a milled powder (particle size range of about 1,000 μm).

Second step: Silicon carbide (mean particle diameter of 50 μm) and zirconium oxide (mean particle diameter of 50 μm) are added to the milled powder, obtained via milling of the combined mass in Step 1, in the respective amounts specified in Table 1 by mass percent (mass %), and such additives and the milled powder are mixed together to provide a molding powder. The respective loadings of silicon carbide and titanium oxide are shown in Table 2.

Third step: The molding powder is molded (at a molding pressure of 100-2,000 kgf/cm²) into a shape such as by an impression, hydrostatic molding or extrusion process, the molded shape is subjected to a heat treatment at about 1,000° C., the pitch is impregnated, a heat treatment is again carried out at about 1,000° C. and finally at about 3,000° C. to prepare a graphite material.

(Evaluation of Graphite Material)

The following procedures were utilized to determine density, thermal expansion coefficient, thermal conductivity, residual amount of the element added, and crystal structure (interplanar spacing (d112)) for the graphite materials obtained.

Density: A 10×10×60 mm sample was cut out from each graphite material and finished to provide a surface smoother than a surface roughness Ra of 12 μm. The sample in such conditions was measured for its mass by using a balance and for its lengths using a micrometer and determined for its volume by multiplying lengths in the three directions. Its density was determined by dividing the mass by the volume.

Thermal expansion coefficient: Using a ThermoPlus TMA-8310, manufactured by Rigaku Corporation, a mean thermal expansion coefficient was measured in nitrogen atmosphere according to a compression loading method over a range from a normal temperature to 400° C.

Measurement of thermal conductivity: According to JIS R1611-1997, thermal conductivity was calculated by the following equation: thermal conductivity=thermal diffusivity× specific heat capacity×bulk density. A φ10×3 mm sample was prepared from the graphite material and measured for thermal diffusivity by a thermal constant measurement apparatus (TC-7000 UVH) in accordance with a laser flash method, manufactured by ULVAC Co., Ltd. Its specific heat capacity was determined from "New-Introduction to carbon material (edited by the Carbon Society of Japan), page 45, Table-1, thermodynamic functions of graphite".

Residual amount of additive: An elemental concentration was measured in vacuum using an EPMA analyzer EMAX 7000 manufactured by Horiba, Ltd.

Crystal structure (interplanar spacing (d112)): An X-ray diffraction device was utilized to achieve measurement in accordance with a Gakushin method wherein a Cu—Kα line was monochromatized by an Ni filter and high-purity silicon was used as a standard substance.

Figure 2:
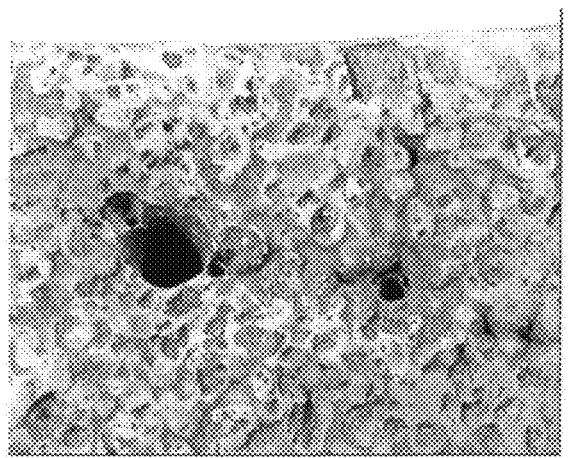
FIG. 2 a microphotograph taken using a scanning electron microscope, showing holes in the graphite material.

The manufacturing conditions used and the properties of the graphite materials obtained in Examples 1-4 and Comparative Examples 1-5 are shown in Table 1. Table 1 also shows evaluation of the occurrence of holes in the graphite materials obtained. The results are also shown. For the graphite materials obtained, evaluation was made as "occurrence of holes" when holes as shown in FIG. 2 were observed or as "no occurrence of holes" when they were not observed.

TABLE 1

| | Manufacturing Conditions Loadings | | Properties of Graphite Material | | | Residual Amount (Elemental Concentration) | | | Presence of Defect |
|---|---|---|---|---|---|---|---|---|---|
| | SiC (mass %) | ZrO₂ (mass %) | Density (Mg/m³) | Thermal Expansion Coefficient $1 \times 10^{-4}$/K | Thermal Conductivity W/(m·K) | Si (mass %) | Zr (mass %) | $d_{112}$ nm | Occurrence of Holes |
| Ex. 1 | 5 | 3 | 1.73 | 3.5 | 250 | 0.1 | 1.3 | 16 | No |
| Ex. 2 | 5 | 5 | 1.74 | 3.5 | 250 | 0.1 | 1.3 | 20 | No |
| Ex. 3 | 5 | 10 | 1.78 | 3.5 | 270 | 0.5 | 2.0 | 23 | No |
| Ex. 4 | 5 | 15 | 1.81 | 3.5 | 270 | 1.8 | 3.0 | 27 | Yes |
| Comp. Ex. 1 | 0 | 0 | 1.78 | 3.0 | 170 | 0 | 0 | 4 | No |
| Comp. Ex. 2 | 5 | 0 | 1.74 | 3.5 | 200 | 0.1 | 0 | 6 | No |
| Comp. Ex. 3 | 15 | 0 | 1.58 | 3.5 | 210 | 0.1 | 0 | 14 | Yes |
| Comp. Ex. 4 | 0 | 15 | 1.83 | 3.5 | 200 | 0 | 2.0 | 12 | Yes |
| Comp. Ex. 5 | 5 | 0.5 | 1.70 | 3.5 | 230 | 0.1 | 1.0 | 14 | No |

As can be clearly seen from the results shown in Table 1, the graphite materials of Examples 1-4 in accordance with the present invention each showed a thickness (d112) of its graphite crystal in the 112 face of not less than 15 nm when subjected to X-ray diffraction and a mean thermal conductivity of 250 W/(m·K) or greater. Accordingly, the graphite materials of Examples 1-4 in accordance with the present invention are capable of efficient heat dissipation.

FIG. 1 is a graph which shows a relationship between 112 face thickness and thermal conductivity for the graphite materials of Examples 1-4 and Comparative Examples 1-5.

As shown in FIG. 1, the thermal conductivity is seen to increase with the 112 face thickness.

Example 5

As shown in Table 2, 5 mass % of silicon carbide (mean particle diameter of 50 μm) and 10 mass % of titanium oxide (mean particle diameter of 50 μm) were added to manufacture a graphite material through the above-outlined first through third steps. The manufacturing conditions and the properties of the graphite material are shown in Table 2.

TABLE 2

| Manufacturing Conditions Loadings | | Properties of Graphite Material | | | | | | |
|---|---|---|---|---|---|---|---|---|
| | | | Thermal Expansion | Thermal | Residual Amount (Elemental Concentration) | | Presence of Defect | |
| SiC (mass %) | TiO$_2$ (mass %) | Density (Mg/m$^3$) | Coefficient $1 \times 10^{-5}$/K | Conductivity W/(m·K) | Si (mass %) | Occurrence of Holes | $d_{112}$ nm | Occurrence of Holes |
| Ex. 5 | 5 | 10 | 1.73 | 3.5 | 270 | 1.0 | 2.5 | 22 | No |

As can be clearly seen from the results shown in Table 2, Example 5 also resulted in obtaining a graphite material which has a thickness of its graphite crystal in the 112 face of not less than 15 nm when subjected to X-ray diffraction and a mean thermal conductivity of not less than 250 W/(m·K). Accordingly, a graphite material is obtained which is capable of dissipating heat efficiently.

(Identification of Elements Incorporated in Graphite Material)

Figure 3:
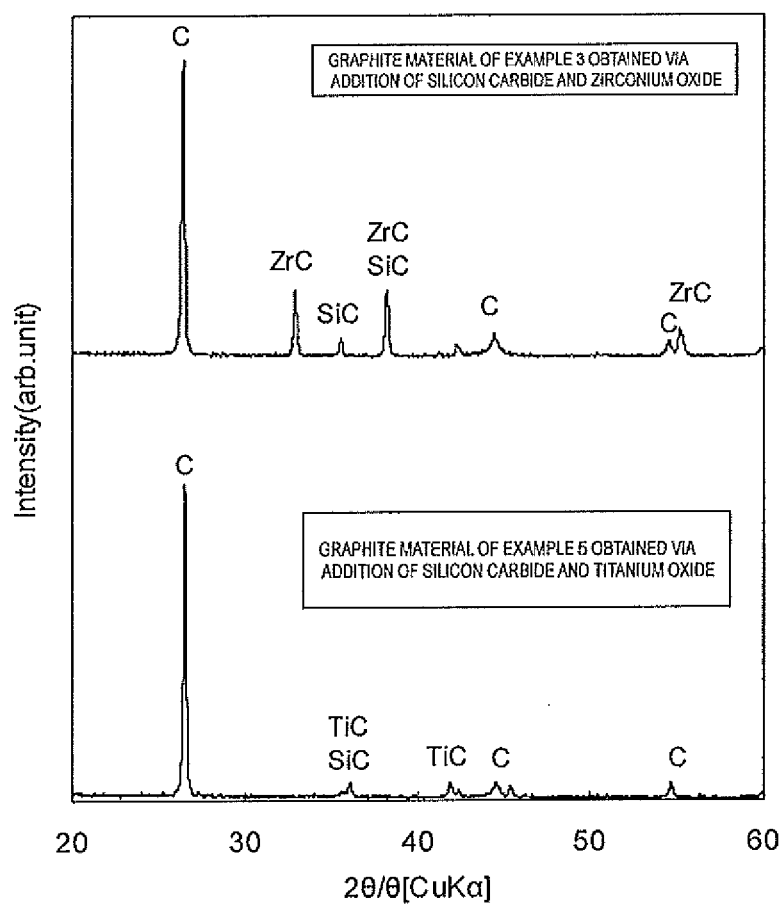
FIG. 3 a graph showing respective X-ray diffraction patterns for the graphite materials obtained in Examples 3 and 5 in accordance with the present invention.

FIG. 3 is a graph showing X-ray diffraction patterns for the graphite materials obtained in Examples 3 and 5. As shown in FIG. 3, peaks are obtained for silicon carbide and zirconium carbide in Example 3 and for silicon carbide and titanium carbide in Example 5. This ascertained the additive elements as remaining in the carbide form in the final graphite material.

The graphite materials of the above Examples can be increased in purity by a high purification treatment according to any conventionally-known method.

(Preparation of Graphite-Metal Composite Material and Metal-Coated Graphite Material)

Copper, copper alloy, aluminum or aluminum alloy was impregnated in the graphite materials of the above Examples. Impregnation of these metals or alloys was achieved by allowing them to melt in an inert argon gas atmosphere and dipping the graphite material in the melt and applying a pressure. The graphite-metal composite materials obtained were found to have good heat-dissipating properties and suit a heat-dissipating member.

Also, copper, copper alloy, aluminum or aluminum alloy was deposited on surfaces of the above graphite-metal composite materials by a plating method to obtain metal-coated graphite materials. The metal-coated graphite materials obtained were found to have good heat-dissipating properties and suit a heat-dissipating member.

The invention claimed is:

1. A graphite material characterized in that it has a thickness of its graphite crystal in the 112 face of nm or greater by X-ray diffraction and a mean thermal conductivity of 250 W/(m·K) or greater over the three directions of X, Y and Z axes and contains 0.1-1.8 mass % of silicon and 1.3-3.0 mass % of zirconium or contains 0.1-1.8 mass % of silicon and 0.1-2.5 mass % of titanium.

2. The graphite material as recited in claim 1, characterized in that said silicon and zirconium or titanium are contained as carbides.

3. The graphite material as recited in claim 1, characterized in that it contains 0.1-1.8 mass % of silicon and 1.3-3.0 mass % of zirconium.

4. The graphite material as recited in claim 3, characterized in that said silicon is contained as silicon carbide.

5. The graphite material as recited in claim 3, characterized in that said zirconium is contained as zirconium carbide.

6. The graphite material as recited in claim 1 characterized in that it contains 0.1-1.8 mass % of silicon and 0.1-2.5 mass % of titanium.

7. The graphite material as recited in claim 6, characterized in that said silicon is contained as silicon carbide.

8. The graphite material as recited in claim 6, characterized in that said titanium is contained as titanium carbide.

9. The graphite material as recited in claim 1, characterized in that it is further subjected to a high purification treatment.

10. The graphite material as recited in claim 9, characterized in that high purification is achieved by delivering a flow of a halogen gas to thereby convert impurities in graphite to low-boiling halides for evaporation.

11. The graphite material as recited in claim 1, characterized in that it is impregnated by a metal or an alloy.

12. The graphite material as recited in claim 11, characterized in that said metal or alloy is copper, copper alloy, aluminum or aluminum alloy.

13. The graphite material as recited in claim 1, characterized in that a surface of the graphite material is coated by a metal.

14. A heat-dissipating member characterized in that it comprises the graphite material recited in claim 1.

15. A semiconductor electronic device comprising the heat-dissipating member recited in claim 14.

16. A method for manufacturing the graphite material recited in claim 1, characterized in that it includes the steps of:
    combining a milled powder, obtained via kneading and milling of a mixture of an aggregate material and a binder, with a silicon-containing compound and a compound containing zirconium or titanium to prepare a molding powder; and
    subjecting the molding powder to molding and a heat treatment.

17. The method for manufacturing the graphite material as recited in claim 16, characterized in that said silicon-containing compound and said compound containing zirconium or titanium are carbides or oxides.

18. The method for manufacturing the graphite material as recited in claim 16, characterized in that said compound containing zirconium or titanium is a zirconium-containing compound.

19. The method for manufacturing the graphite material as recited in claim 18, characterized in that said silicon-containing compound is silicon carbide.

20. The method for manufacturing the graphite material as recited in claim 18, characterized in that said zirconium-containing compound is zirconium oxide.

21. The method for manufacturing the graphite material as recited in claim 16, characterized in that said compound containing zirconium or titanium is a titanium-containing compound.

22. The method for manufacturing the graphite material as recited in claim 21, characterized in that said silicon-containing compound is silicon carbide.

23. The method for manufacturing the graphite material as recited in claim 21, characterized in that said titanium-containing compound is titanium oxide.

24. The method for manufacturing the graphite material as recited in claim 16, characterized in that said heat treatment is carried out at 2,800-3,200° C.

\* \* \* \* \*